(12) United States Patent
Patel et al.

(10) Patent No.: US 6,506,062 B1
(45) Date of Patent: Jan. 14, 2003

(54) CIRCUIT BOARD HAVING AN INTEGRATED CIRCUIT BOARD CONNECTOR AND METHOD OF MAKING THE SAME

(75) Inventors: Vijay Balubhai Patel, Westland, MI (US); Hsin-Hong Huang, West Bloomfield, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/920,205

(22) Filed: Aug. 1, 2001

(51) Int. Cl.[7] .......................... H01R 12/00; H05K 1/00
(52) U.S. Cl. .......................................... 439/78; 174/267
(58) Field of Search .................... 439/78, 55; 174/267, 174/254; 29/846

(56) References Cited

U.S. PATENT DOCUMENTS

| | | | |
|---|---|---|---|
| 3,536,545 A | 10/1970 | Traynor et al. ............... 216/95 |
| 3,801,388 A | 4/1974 | Akiyama et al. ............... 156/3 |
| 3,957,553 A | 5/1976 | Smith .......................... 156/22 |
| 4,097,394 A | 6/1978 | Gerlach et al. ............. 252/79.5 |
| 4,404,059 A | 9/1983 | Livshits et al. ............. 156/629 |
| 4,521,476 A | 6/1985 | Asai et al. ................... 428/209 |
| 4,659,425 A | 4/1987 | Eggers et al. ............... 156/630 |
| 4,859,281 A | 8/1989 | Goltz .......................... 156/666 |
| 5,046,954 A | * 9/1991 | Schmedding ................. 439/70 |
| 5,227,008 A | 7/1993 | Klun et al. ................. 156/630 |
| 5,433,819 A | 7/1995 | McMeen ..................... 216/20 |
| 5,738,797 A | 4/1998 | Belke, Jr. et al. ............. 216/16 |
| 5,976,391 A | 11/1999 | Belke. Jr. et al. ............. 216/13 |
| 6,019,910 A | 2/2000 | Achari et al. ............... 252/79.5 |
| 6,111,204 A | 8/2000 | Goenka ....................... 174/257 |
| 6,168,725 B1 | 1/2001 | Achari et al. ................. 216/13 |
| 6,217,783 B1 | 4/2001 | Goenka et al. ............... 216/15 |
| 6,248,247 B1 | 6/2001 | Goenka et al. ............... 216/15 |
| 6,250,541 B1 | 6/2001 | Shangguan et al. ......... 228/208 |
| 6,270,354 B2 | 8/2001 | Li et al. ........................ 439/55 |
| 6,271,481 B1 | 8/2001 | Goenka et al. ............. 174/261 |
| 6,274,819 B1 | 8/2001 | Li et al. ..................... 174/254 |
| 6,280,253 B1 | 8/2001 | Kraus et al. ................ 439/621 |
| 6,327,149 B1 | 12/2001 | Goenka ....................... 361/720 |
| 6,331,680 B1 | 12/2001 | Klassen et al. ............. 174/261 |

OTHER PUBLICATIONS

Sterns, "Flexible Printed Circuitry", McGraw–Hill, Copyright 1996, Chapter 8, pp. 125–247.

Wernick, et al, "The Surface Treatment and Finishing of Aluminum and its Alloys", ASM International, Finishing Publications Ltd., Chapter 4, Chemical Cleaning and Etching, pp. 198–200.

* cited by examiner

*Primary Examiner*—Javaid Nasri
(74) *Attorney, Agent, or Firm*—Brinks Hofer Gilson & Lione

(57) ABSTRACT

A substantially rigid circuit board connector 60 which is made by foldably coupling an electrically conductive circuit board portion 14 onto the body 46 of a rigid member 40, while allowing the tapered end portion 42 of the rigid member 40 to remain exposed.

20 Claims, 2 Drawing Sheets

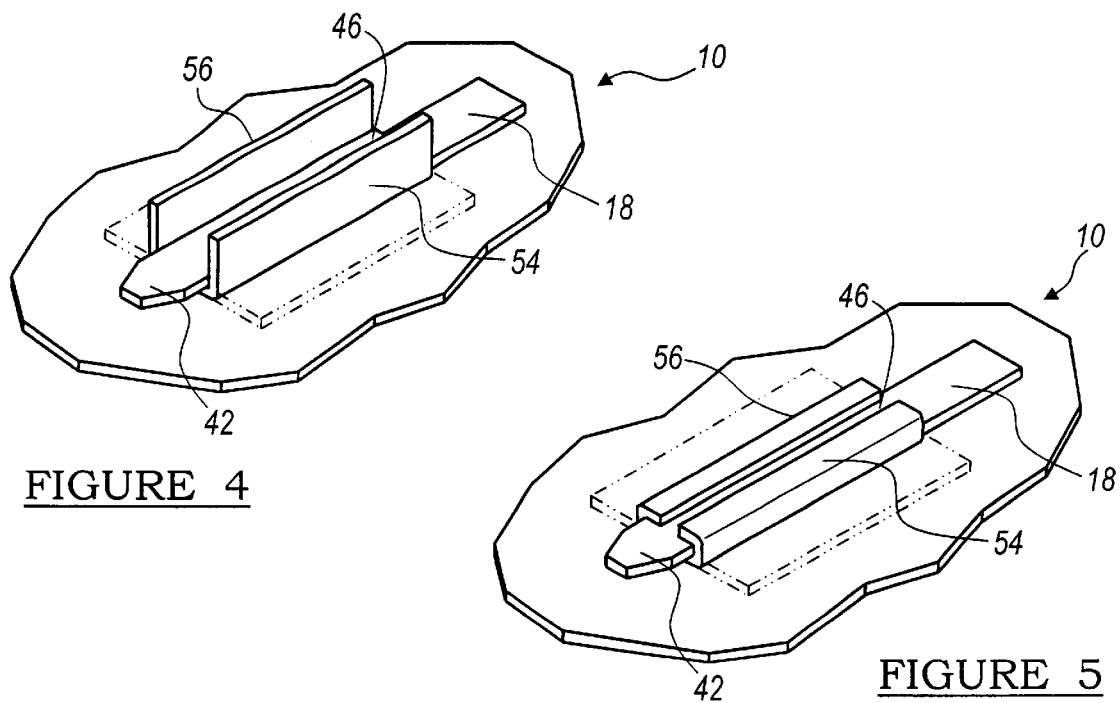
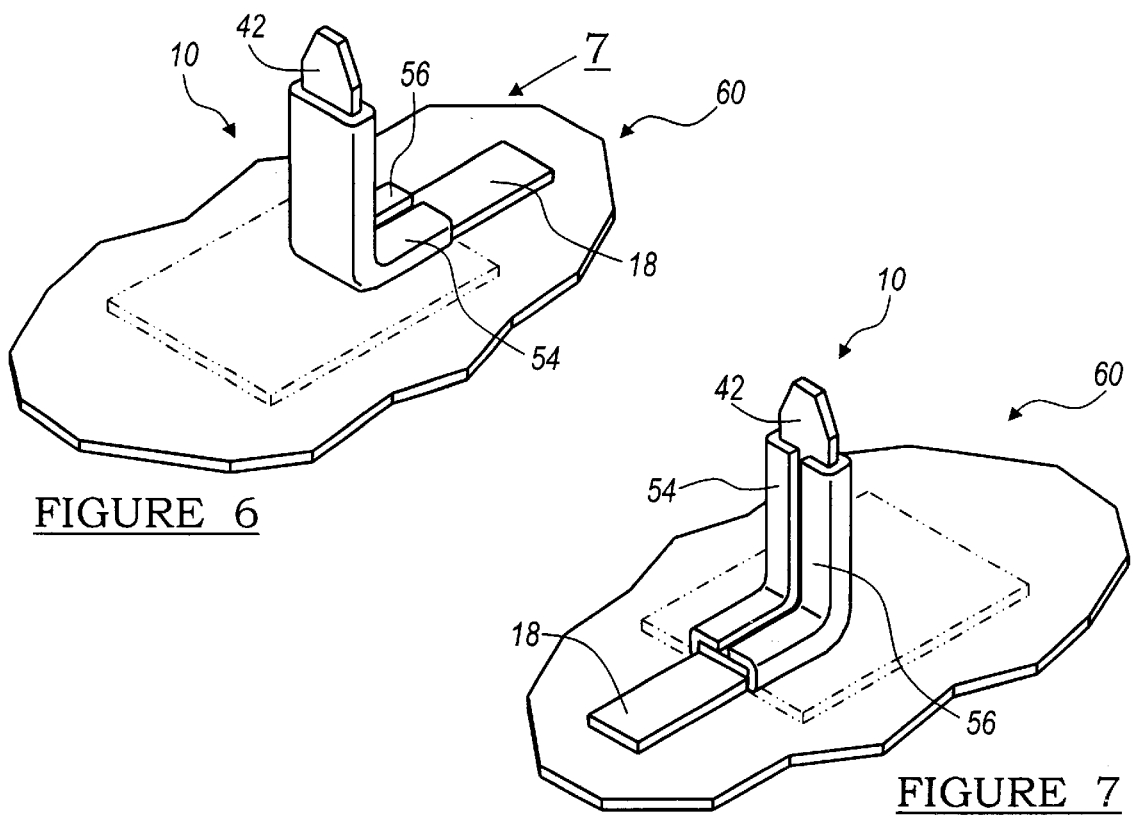

CIRCUIT BOARD HAVING AN INTEGRATED CIRCUIT BOARD CONNECTOR AND METHOD OF MAKING THE SAME

FIELD OF THE INVENTION

The present invention relates to a circuit board connector and to a method for making a circuit board connector, and more particularly, to a substantially rigid circuit board connector which selectively allows a circuit board to be securely and selectively connected and/or coupled to another connector, apparatus, assembly, device, circuit board and/or electrical/electronic component.

BACKGROUND OF THE INVENTION

Circuit boards operatively include various types of electrical and electronic components and/or elements which cooperatively provide one or more desired functions and/or features. In order to allow these various types of functions and/or features to be achieved and/or in order to allow various types of applications and/or needs to be met, the circuit boards must be physically and communicatively coupled to other circuit boards, apparatuses, assemblies, components, and/or devices, such as an electrical power source.

Particularly, in order to allow these circuit boards to be desirably coupled in the foregoing manner, it is necessary to physically couple or connect at least one electrically conductive portion of each of the circuit boards to a respective connector or connector assembly which cooperatively, respectively, physically, and communicatively couple the electrically conductive circuit board portions in the previously delineated and desired manner.

Typically, an electrically conductive circuit board portion is attached, by use of solder, to one such respective connector and/or connector assembly. The solder then hardens and forms a solder joint which physically and communicatively couples the connector and/or connector assembly to the electrically conductive circuit board portion.

While the solder does allow the circuit board to be connected to a connector or connector assembly, it does have several drawbacks. That is, the solder joint structurally degrades (e.g., cracks) over time, thereby preventing the circuit board from properly remaining attached to the connector or connector assembly and potentially and undesirably causing failure and/or malfunction of the circuit board and/or of the various other devices, components, assemblies, components, circuit boards, and apparatuses, to which the circuit board was operatively coupled. The creation of the solder joint also undesirably increases assembly and/or production cost and time.

While some attempts have been made to removably and directly attach the electrically conductive portion of a circuit board to a connector and/or connector assembly, such attempts have substantially failed to produce a relatively secure and/or reliable interconnection due to the relative structural weakness and the relatively diminutive size and shape of the electrically conductive portion of the circuit board.

There is therefore a need for a circuit board connector and for a method for producing such a circuit board connector which overcomes some or all of the previously delineated drawbacks associated with prior connectors and connector assemblies, and which allows a circuit board to be relatively securely, reliably, and removably attached and/or physically and electrically coupled to a connector and/or connector assembly, thereby allowing the circuit board to be operatively coupled to a device, apparatus, component, assembly and/or other circuit board in order that a desired function or application may be performed.

BRIEF SUMMARY OF THE INVENTION

It is a first object of the present invention to provide a circuit board connector and a method for providing and/or creating such a circuit board connector which overcomes some or all of the previously delineated drawbacks of prior circuit board connectors/connector assemblies and of prior circuit board connector forming methodologies and techniques.

It is a second object of the invention to provide a method for producing a circuit board connector assembly which overcomes some or all of the previously delineated drawbacks of prior circuit board connector forming methodologies and techniques and which allows for the selective and relatively efficient and reliable attachment of a circuit board to a connector, device, apparatus, circuit board, and/or other assembly and/or component and/or electrical/electronic element.

It is a third object of the invention to provide a method for producing a circuit board connector assembly which overcomes some or all of the previously delineated drawbacks of prior circuit board connector/connector assembly forming methodologies and techniques and which allows for the selective formation of electrically conductive circuit board connector portions which are substantially rigid and which may be selectively and operatively inserted within and/or coupled to conventional and commercially available connectors, components, elements, devices, assemblies, apparatuses, and/or other circuit boards.

According to a first aspect of the present invention a circuit board connector assembly is provided. The circuit board connector assembly includes a substantially rigid member having a tapered end portion; and a relatively flexible portion which is movably secured within and/or upon a circuit board and which foldably contains and substantially covers the body portion of the substantially rigid member while allowing the tapered end to remain exposed, thereby forming a circuit board connector.

According to a second aspect of the present invention a method for making a connector for use with a circuit board of the type having at least one electrically conductive portion is provided. The method includes the steps of providing a rigid member having a body portion and a tapered end portion; and folding the at least one electrically conductive portion of the circuit board onto the body portion of the rigid member, thereby creating a connector.

These and other objects, aspects, and advantages of the present invention will become apparent upon reading the following detailed description of the invention in combination with the accompanying drawings.

BRIEF DESCRIPTION OF THE DRAWINGS

FIG. 4 is a view similar to that of FIG. 3 but illustrating the movement of the at least one electrically conductive portion in accordance with another step in the circuit board connector formation process according to the teachings of the preferred embodiment of the invention;

FIG. 5 is a view similar to that of FIG. 3 but illustrating the movement of the at least one electrically conductive portion in accordance with yet another step in the circuit board connector formation process according to the teachings of the preferred embodiment of the invention;

FIG. 6 is a perspective view of a circuit board connector which is made in accordance with the teachings of the preferred embodiment of the invention; and FIG. 7 is a view similar to that of FIG. 6 but which is taken in the direction of arrow 7.

DETAILED DESCRIPTION OF THE INVENTION

Referring now to FIGS. 1–7, there is shown a method and/or a process 10 for selectively forming and/or creating a circuit board connector upon and/or within a circuit board 12, in accordance with the teachings of the preferred embodiment of the invention. Particularly, circuit board 12 is of the type which has or which includes and/or which integrally contains at least one electrically conductive and substantially flexible and/or bendable portion or "trace" 14.

Figure 1:
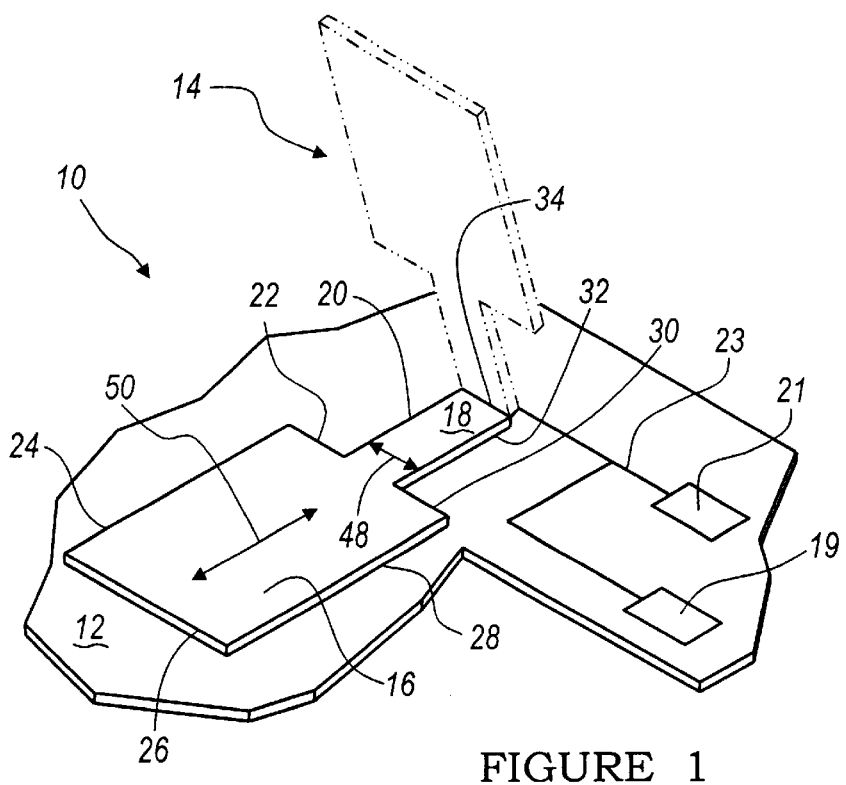
FIG. 1 is a top perspective and fragmented view of a circuit board having at least one electrically conductive portion which is made to form a circuit board connector in accordance with the teachings of the preferred embodiment of the invention.

Specifically, as shown best in FIG. 1, electrically conductive circuit board portion 14 has a first generally rectangular and/or square portion 16 and a narrower and generally rectangular "handle" portion 18 which is attached to and/or which is integrally formed within portion 16, and which is physically and electrically connected, by use of a conductive bus 23, to electronic/electrical components such as components 19, 21, which cooperatively perform some desired function and which may be remotely positioned from circuit board 12, or alternatively reside upon and/or be integrally formed within circuit board 12. Various other types and numbers of components 19, 21 and busses 23 may be utilized in other embodiments of the invention.

It should be realized that the respective shapes and sizes of portions 14, 16, and 18 may vary from the respective shapes and sizes which are shown within the attached FIGS. 1–7. Particularly, it should be realized that the illustrated shapes and sizes of portions 14–18 and are not meant to limit the generality of the invention, but are used to exemplify the principles of the invention. In one non-limiting embodiment of the invention, portions 14 and 18 comprise conventional and commercially available copper material and the remainder of board 12 (with the exception of bus 23) comprises a conventional and commercially available dielectric material.

In the first step of process 10, portion 14 is "cut" or selectively severed from the circuit board 12 along edges 20, 22, 24, 26, 28, 30, and 32, thereby allowing portion 14 to remain attached to the circuit board 12 along edge 34. In this manner, portion 14 is made to be movably attached and/or movably secured to and/or upon/within the circuit board 12, thereby allowing portion 14 to be moved from and/or between a first position in which portion 14 is substantially co-planar with and/or to circuit board 12, to a second position which is shown in phantom within FIG. 1.

Figure 2:
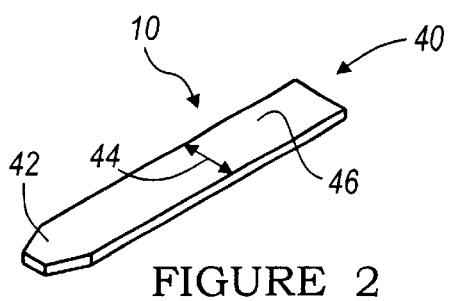
FIG. 2 is a top perspective view of a rigid member which is used in the circuit board connector forming process of the preferred embodiment of the invention.

Process 10, as shown best in FIG. 2, requires the acquisition and/or formation and/or creation of a substantially rigid member 40 having a tapered end 42 and a generally rectangular body 46. In the present embodiment of the invention, member 40 is generally flat. However, other shapes and/or sizes of member 40 may be used in other non-limiting embodiments of the invention. In one non-limiting embodiment, member 40 is formed from a substantially rigid material such as a conventional and commercially available metal or a rigidized plastic or composite material. In a further non-limiting embodiment of the invention, member 40 may be formed from a material having electrically conductive properties, such as copper. Alternately, member 40 may be formed from a material having dielectric properties. It should be appreciated, as is more fully delineated below, that member 40 is adapted to substantially and selectively reinforce and/or provide structural support for the relatively flexible and selectively movable member 14, thereby allowing member 14 to be selectively inserted within and operatively and communicatively coupled to a connector, connector assembly, circuit board, apparatus, component, and/or device.

Figure 3:
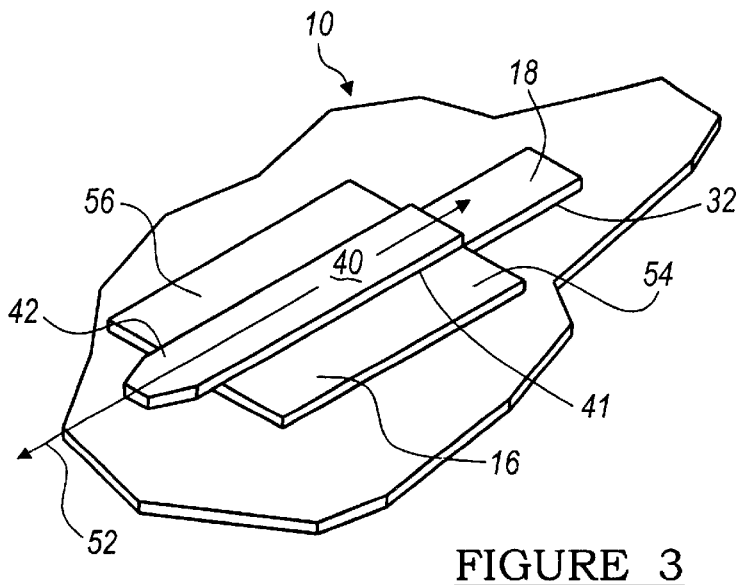
FIG. 3 is a top perspective view of the placement of the rigid member, which is shown in FIG. 2; upon the at least one electrically conductive circuit board portion, which is shown in FIG. 1, in accordance with the circuit board connector formation process of the preferred embodiment of the invention.

In the third step of process 10, as shown best in FIG. 3, the substantially rigid member 40 (i.e., body portion 46) is made to operatively overlay portion 16 while end portion 42 overhangs portion 16. Particularly, in one non-limiting embodiment of the invention, the width 44 of the body 46 of member 40 is substantially equal to the width 48 of portion 18. Further, in one non-limiting embodiment, body 46 is aligned with portion 18 and is aligned with the longitudinal axis of symmetry 50 of portion 16 (e.g., the longitudinal axis of symmetry 52 of portion 46 overlays the longitudinal axis of symmetry 50). In one non-limiting embodiment of the invention, member 40 is selectively attached to portions 18 and 16 by the use of a conventional and commercially available adhesive material 41. In another non-limiting embodiment, member 40 is selectively attached to portions 18 and 16 by the use of a conventional and commercially available solder material. In a further non-limiting embodiment of the invention, member 14 operatively overlays member 40 (i.e., body portion 46).

In the fourth and fifth steps of process 10, as shown best in FIGS. 4 and 5, portions or regions 54, 56 of portion 16 are bent and/or foldably coupled over and/or onto body portion 46 of member 40, effective to substantially enclose and/or contain the body portion 46 while concomitantly allowing the tapered end 42 to remain or to be exposed.

In the fifth step of process 10, as shown best in FIGS. 6 and 7, body portion 46 and portion 16 are concomitantly bent and/or folded in a desired manner, effective to form a terminal or connector assembly 60, which in one non-limiting embodiment, is substantially "L" shaped. In alternate embodiments, connector assembly 60 may be of any other desired shape or size. It should be appreciated that in other non-limiting embodiments of the invention, only portion 14 is bent and folded in the previously described manner, thereby obviating the need to fold or bend member 40.

It should be appreciated that by applying, attaching, coupling, and/or connecting member 40, which is substantially rigid, to portion 14, which is substantially and relatively flexible, member 40 substantially reinforces and/or structurally supports portion 14 and cooperates with portion 14 to form a substantially and relatively rigid circuit board terminal or connector assembly 60.

Terminal or connector assembly 60 is therefore adapted to be insertably and operatively placed within various types of connectors, connector assemblies, apparatuses, components, devices, and/or circuit boards, thereby allowing components 19, 21 to be physically and communicatively coupled to these other components, apparatuses, and assemblies in order to provide an overall desired function and/or application. Therefore, the formed electrical connector 60 provides a substantially reliable circuit board interconnection since member 40 structurally strengthens portion 14. Furthermore, such an interconnection is achieved without the use of solder.

Furthermore, the tapered end 42 of the substantially rigid member 40 protrudes beyond the folded portion 16, effective to allow the connector 60 to be relatively easily and securely inserted into a connector assembly (i.e., "a female type receiving connector") and further operatively wipes or "cleans" the electrical contacts of the receiving connector, thereby further increasing the overall reliability of the created interconnection. Lastly, it should be appreciated that circuit board 12 may employ multiple terminal or circuit board connector assemblies 60 which operatively and selectively couple and/or connect various portions of the circuit board 12 in the foregoing manner.

It should be understood that the invention is not limited to the exact embodiment or construction which has been illustrated and described but that various changes may be made without departing from the spirit and the scope of the invention.

What is claimed is:

1. A circuit board having an integrated circuit board connector, the circuit board comprising:

at least one foldable member having an attached portion and a severable portion; and a substantially rigid member having a body portion and a tapered end portion adapted for coupling with an electrical device, and wherein said severable portion foldably contains and substantially covers said body portion, and wherein said tapered end extends beyond said severable portion, thereby forming an integrated circuit board connector.

2. The circuit board of claim 1 wherein said relatively flexible portion is electrically conductive.

3. The circuit board of claim 2 wherein said relatively flexible electrically conductive portion comprises copper.

4. The circuit board of claim 3 wherein said substantially rigid member comprises a plastic material.

5. The circuit board of claim 4 wherein said tapered end portion protrudes from said flexible electrically conductive member.

6. The circuit board of claim 3 wherein said substantially rigid member comprises metal.

7. A method for making an integrated circuit board connector for use with a circuit board of a type having at least one electrically conductive portion, said method comprising the steps of:

providing a substantially rigid member having a body portion and an end portion;

tapering said end portion of said substantially rigid member;

severing said at least one electrically conductive portion from said circuit board such that said at least one electrically conductive portion is movably attached to said circuit board;

placing said body portion of said substantially rigid member onto said at least one electrically conductive portion; and folding said at least one electrically conductive portion of said circuit board about said body portion of said rigid member, thereby creating an integrated circuit board connector.

8. The method of claim 7 wherein said electrically conductive portion comprises a copper material.

9. The method of claim 8 wherein said substantially rigid member comprises a plastic material.

10. The method of claim 8 wherein said substantially rigid member comprises a metal material.

11. The method of claim 7 wherein said electrically conductive portion is integrally formed within said circuit board.

12. A method for forming an integrated circuit board connector, said method being adapted for use with a circuit board having at least one electrically conductive portion, said method comprising the steps of:

causing said at least one electrically conductive portion to be movably attached to said circuit board;

providing a substantially rigid member having a tapered end portion;

placing said substantially rigid member upon said at least one electrically conductive portion and causing said tapered end portion to overhang said at least electrically conductive portion;

folding said at least one electrically conductive portion over said substantially rigid member while allowing said tapered end to be exposed; and bending said electrically conductive member, thereby forming a connector.

13. The method of claim 12 wherein said electrically conductive portion comprises copper.

14. The method of claim 12 wherein said electrically conductive portion is integrally formed within said circuit board.

15. The method of claim 14 wherein said step of causing said at least one electrically conductive portion to be movably attached to said circuit board comprises severing all but one edge portion of said electrically conductive portion from said circuit board.

16. The method of claim 15 wherein said electrically conductive portion has a first longitudinal axis of symmetry, wherein said substantially rigid member has a second longitudinal axis of symmetry, and wherein said second longitudinal axis of symmetry overlays said first longitudinal axis of symmetry.

17. The method of claim 16 wherein said electrically conductive portion has a substantially square region and said substantially rigid member is placed only upon said substantially square region.

18. The method of claim 12 wherein said substantially rigid member is electrically conductive.

19. The method of claim 12 wherein said substantially rigid member comprises a dielectric material.

20. The method of claim 12 further comprising the step of bending said substantially rigid member.

* * * * *